United States Patent
Zhang et al.

(10) Patent No.: US 10,089,917 B2
(45) Date of Patent: Oct. 2, 2018

(54) PHOTOELECTRIC SENSOR AND DISPLAY PANEL

(71) Applicant: Peking University Shenzhen Graduate School, Guangdong (CN)

(72) Inventors: Shengdong Zhang, Guangdong (CN); Congwei Liao, Guangdong (CN); Zhijin Hu, Guangdong (CN); Shijie Cao, Guangdong (CN); Junmei Li, Guangdong (CN); Wenjie Li, Guangdong (CN)

(73) Assignee: Peking University Shenzhen Graduate School, Guangdong (CN)

( * ) Notice: Subject to any disclaimer, the term of this patent is extended or adjusted under 35 U.S.C. 154(b) by 0 days.

(21) Appl. No.: 15/572,317

(22) PCT Filed: Mar. 24, 2016

(86) PCT No.: PCT/CN2016/077261
§ 371 (c)(1),
(2) Date: Nov. 7, 2017

(87) PCT Pub. No.: WO2016/177170
PCT Pub. Date: Nov. 10, 2016

(65) Prior Publication Data
US 2018/0144678 A1 May 24, 2018

(30) Foreign Application Priority Data
May 7, 2015 (CN) .......................... 2015 1 0229458

(51) Int. Cl.
*G02F 1/01* (2006.01)
*G09G 3/20* (2006.01)
(Continued)

(52) U.S. Cl.
CPC ......... *G09G 3/2092* (2013.01); *G02F 1/0105* (2013.01); *G06F 3/0412* (2013.01);
(Continued)

(58) Field of Classification Search
CPC ............. H01L 27/1214; H01L 27/1461; H01L 27/14643; H01L 27/14609; G09G 3/34;
(Continued)

(56) References Cited

U.S. PATENT DOCUMENTS

| | | | |
|---|---|---|---|
| 4,866,291 A * | 9/1989 | Shimada | H01L 27/14665 250/208.1 |
| 2014/0139713 A1* | 5/2014 | Gomi | H01L 27/14618 348/308 |

* cited by examiner

Primary Examiner — Chuong A Luu
(74) Attorney, Agent, or Firm — Lee & Hayes, PLLC

(57) ABSTRACT

A photoelectric sensor and a display panel comprise: a pulse transmission unit comprising a control node, after obtaining a driving voltage, the control node of the pulse transmission unit transmitting first clock signals to a signal output terminal; a pulse control unit configured to receive scanning signals from a signal input terminal and charging the control node of the pulse transmission unit so as to provide the driving voltage; and photoelectric sensing unit configured to provide a leakage current in response to the intensity of external illumination when receiving the external illumination, the leakage current discharging the control node of the pulse transmission unit, so that the voltage at the control node of the pulse transmission unit is less than the driving voltage after a period of time. The circuit of the photoelectric sensor utilizes the existing scanning signals and clock signals of a conventional display panel, with no need for an extra control signal, and therefore the circuit is simple in structure, and more suitable for being integrated on the display panel.

10 Claims, 6 Drawing Sheets

(51) Int. Cl.
*H01L 29/66* (2006.01)
*H01L 27/12* (2006.01)
*G06F 3/041* (2006.01)

(52) U.S. Cl.
CPC ...... *H01L 27/1214* (2013.01); *H01L 29/6675* (2013.01); *H01L 29/66265* (2013.01)

(58) Field of Classification Search
CPC ............. G09G 3/3406; G09G 3/34132; G09G 3/2092; G06F 3/0412; G06F 3/041; G02F 1/01; G02F 1/0105
USPC .......................................................... 257/72
See application file for complete search history.

(a)

(b)

PHOTOELECTRIC SENSOR AND DISPLAY PANEL

CROSS REFERENCE TO RELATED APPLICATIONS

This application is a 35 USC § 371 filing of International Application No. PCT/CN2016/077261, filed Mar. 24, 2016, entitled PHOTOELECTRIC SENSOR AND DISPLAY PANEL, which claims the benefit of China Patent Application No. CN201510229458.9, filed May 7, 2015, entitled PHOTOELECTRIC SENSOR AND DISPLAY PANEL, which are incorporated herein by reference.

TECHNICAL FIELD

Aspects of the present disclosure relate to the electronic circuit field, and specifically to a photoelectric sensor.

BACKGROUND

Thin Film Transistor (TFT) array based panel display technology is the main stream of nowadays display technologies. This is mainly because the manufacture process of TFT is relatively simple, the process cost is low, and is suitable for massive production. With the development of TFT panel display technology, more and more display driver and other functional modules may be implemented by TFT integrated circuit. Row and column driving circuits, power circuit, photoelectric sensing circuit, and so on, which are manufactured by TFT as the major component, are integrated on a display panel to form a System on Panel (SoP). Compared with a conventional display panel, the SoP display panel has the following advantages. First, the number of peripheral driving chips of the display panel is small, so the number of chip pins and connection lines is small correspondingly. Second, the bezel of a display panel is narrow, so that the module of related display panel looks neat and compact. Third, the working sequence of the display panel's module is simple, and the manufacture cost is low. Fourth, the resolution of the display panel is high. Fifth, the display panel has a high reliability, and thus can be easily manufactured to be a flexible display panel. Sixth, touch-control devices, temperature devices and photoelectric sensing devices are easily integrated on the SoP display panel, so the display panel has a higher added value.

In a traditional display panel, photoelectric sensors are placed separately. Such separately placed photoelectric sensors render the bezel of SoP display panel wide. As a result, advantages of SoP display panel cannot be fully exploited. Although researchers in Japan and Korea have reported some photoelectric sensors implemented by TFT technology, the implementations of these schemes are generally independent to the display panel, and extra control signals are needed, therefore the feasibility of which is low. Therefore, how to implement photoelectric sensing function in the interior or the border of TFT array and how to use the resources of the TFT array reasonably without significantly increasing the complexity of display panel are key points to implement TFT integrated photoelectric sensor.

SUMMARY

According to a first aspect, the present application provides a photoelectric sensor, comprising:
a signal input terminal, configured to receive a scanning signal;
a signal output terminal, configured to output a pulse signal;
a pulse transmission unit, comprising a control node, after obtaining a driving voltage, the control node of the pulse transmission unit transmits a first clock signal to the signal output terminal;
a pulse control unit, configured to receive the scanning signal from the signal input terminal and charge the control node of the pulse transmission unit so as to provide the driving voltage;
a photoelectric sensing unit, configured to provide a leakage current in response to intensity of external illumination when receiving the external illumination, wherein the control node of the pulse transmission unit is discharged due to the leakage current, so that voltage at the control node of the pulse transmission unit is less than the driving voltage after a period of time.

According to a second aspect, the present application provides a display panel comprising the aforementioned photoelectric sensor.

According to the photoelectric sensor and the display panel of the above embodiments, because the pulse transmission unit, the pulse control unit, and the photoelectric sensing unit use the existing scanning signals and clock signals of a conventional display panel, with no need for an extra control signal, the circuit is simple in structure and the process is easy to implement.

DETAILED DESCRIPTION

The present application is explained in detain below according to the embodiments in connection with the appended drawings.

The terminologies used herein are explained.

The transistor in this application is a three-terminal transistor, wherein the three terminals are a control electrode, a first electrode, and a second electrode. When the transistor is a bipolar transistor, the control electrode is the base of the bipolar transistor, the first electrode is the collector or the emitter of the bipolar transistor, and correspondingly, the second electrode is the emitter or the collector of the bipolar transistor. When the transistor is a field effect transistor, the control electrode is the gate of the field effect transistor, the first electrode is the drain or the source of the field effect transistor, and correspondingly, the second electrode is the source or the drain of the field effect transistor.

In the present application, the transistor may be a bipolar transistor, and may also be a field effect transistor. In some preferred embodiments, the inventor uses the thin film transistor (TFT) of the field effect transistor to implement the photoelectric sensor and the display panel of the present application. The reasons are as follows.

Among field effect transistors, the electrical characteristic of the thin film transistor (TFT) may change significantly in the presence of external illumination. For example, compared with the thin film transistor in the dark state, the threshold voltage of the thin film transistor in illumination state is reduced, and the off-state current is increased by orders of magnitude. Due to this photoelectric characteristic of thin film transistor, thin film transistors are adopted to form a photoelectric sensor. Furthermore, since the photoelectric sensor is manufactured by thin film transistors, it is easily integrated into SoP display panels, which are also formed with thin film transistors as main circuit elements.

The photoelectric sensor and the display panel of the present application are illustrated by taking the N-type thin film transistor as the transistor for examples. Correspondingly, the control electrode of the transistor is the gate, the first electrode is the drain, and the second electrode is the source.

Embodiment I

Figure 1:
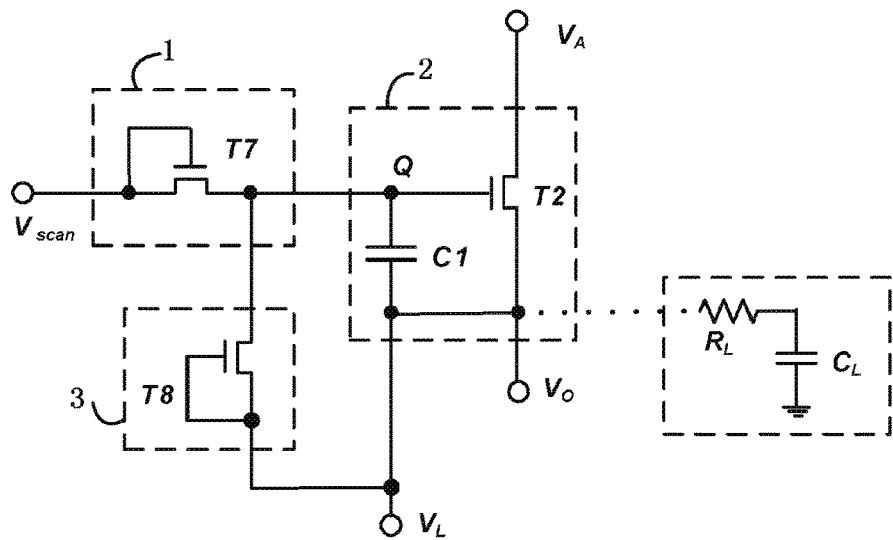
FIG. 1 illustrates a structure diagram of a photoelectric sensor according to Embodiment I of the present application.

Please refer to FIG. 1. This embodiment discloses a photoelectric sensor, which comprises a pulse transmission unit 2, a pulse control unit 1, and a photoelectric sensing unit 3.

The pulse transmission unit 2, coupled between an input terminal of a first clock signal $V_A$ and a signal output terminal, comprises a control terminal Q. When the control terminal Q of the pulse transmission unit 2 receives a driving voltage, the first clock signal $V_A$ is transmitted to the signal output terminal. There are many ways to implement the pulse transmission unit 2. In a preferred embodiment, the pulse transmission unit 2 may comprise a transistor T2. The transistor T2 may be a non-photosensitive transistor. Specifically, the transistor T2 may be in shaded state which makes it a non-photosensitive transistor. The control electrode of the transistor T2 may be the control node of the pulse transmission unit 2. The first electrode of the transistor T2 may be configured to receive a first clock signal $V_A$. The second electrode of the transistor T2 may be coupled to the signal output terminal, configured to, after the transistor T2 is turned on by the driving voltage, charge the signal output terminal when the first clock signal $V_A$ is at the high voltage level and discharge the signal output terminal when the first clock signal $V_A$ is at the low voltage level. In some preferred embodiment, a storage capacitance C1 may be coupled between the control electrode and the second electrode of the transistor T2 for storing the charges of the control node Q, so that the control electrode of the transistor T2 can obtain a stable driving voltage.

The pulse control unit 1 is coupled between the signal input terminal and the control node Q of the pulse transmission unit 2 for receiving inputted scanning signals $V_{scan}$ from the signal input terminal to charge the control node Q of the pulse transmission unit 2 to provide the above driving voltage. As stated above, this driving voltage refers to a voltage that can turn on the transistor T2, connecting the first and the second electrodes of the transistor T2. There are also many ways to implement the pulse control unit 1. In a preferred embodiment, the pulse control unit 1 may comprise a transistor T7. The transistor T7 may be a non-photosensitive transistor. The first electrode of the transistor T7 is coupled to its control electrode. The first electrode of the transistor T7 is also coupled to the signal input terminal for receiving the scanning signal $V_{scan}$. The second electrode of the transistor T7 is coupled to the control node Q of the pulse transmission unit 2 for charging the control node Q of the pulse transmission unit 2 when the scanning signal $V_{scan}$ is at the high voltage level to provide the driving voltage.

The photoelectric sensing unit 3 is coupled between the low voltage supply and the control node Q of the pulse transmission unit 2 for providing a leakage current in response to the intensity of external illumination when receiving external illumination. The leakage current performs discharging of the control node Q of the pulse transmission unit 2, so that after a period of time the voltage of the control node Q of the pulse transmission unit 2 is less than the driving voltage for turning on the transistor T2. There are many ways to implement the photoelectric sensing unit 3. In a preferred embodiment, the photoelectric sensing unit 3 may comprise a transistor T8. The transistor T8 may be a photosensitive transistor. Specifically, the transistor T8 is set in the photosensitive state to make it a photosensitive transistor. The first electrode of the transistor T8 is coupled to its control electrode. The first electrode of the transistor T8 is also coupled to a low voltage supply $V_L$. The second electrode of the transistor T8 is coupled to the control node Q of the pulse transmission unit 2. Because the transistor T8 is a photosensitive transistor, it has a leakage current in response to external illumination. As such, the transistor T8 is used to provide a leakage current responding to the intensity of the external illumination when receiving the external illumination. This leakage current flows from the second electrode of the transistor T8 to the first electrode, to discharge the control node Q of the pulse transmission unit 2, so that the voltage of the control node Q of the pulse transmission unit 2 is less that the driving voltage.

Figure 2:
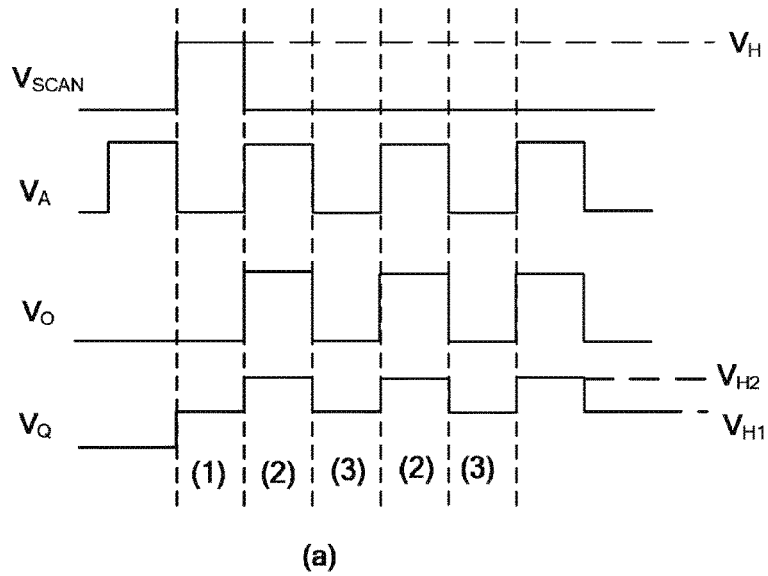
FIG. 2 illustrates sequence diagrams of the photoelectric sensor in Embodiment I of the present application.
Figure 2:
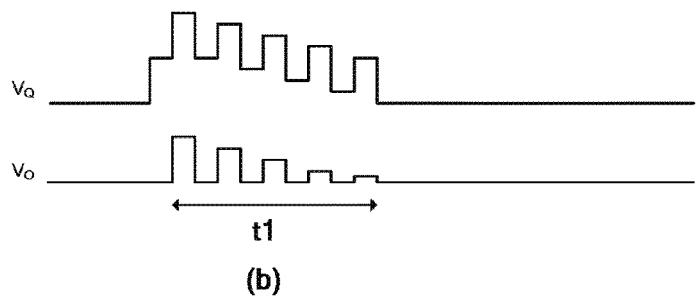

FIG. 2 is a sequence diagram of the photoelectric sensor. The work procedure of the photoelectric sensor is explained below by stages in connection with FIGS. 1 and 2.

The photoelectric sensor has two stages when working: voltage preset stage and photo sensing stage.

FIG. 2(a) is a sequence diagram of the photoelectric sensor within limited several row scanning durations, wherein one row scanning duration is one half of the period of the first clock signal $V_A$ shown in this figure.

FIG. 2(b) is sequence diagrams of the signal output terminal and the internal control node Q of the photoelectric sensor within one frame time.

Voltage Preset Stage

Please refer to FIG. 2(a). During the voltage preset stage, the voltage of the internal electrical node, i.e., the control node Q, of the photoelectric sensor is uniformly preset to a high voltage level when or before the photoelectric sensor receives the high voltage level of the scanning signal $V_{scan}$. Specifically, the voltage of the control node Q is preset to a high voltage level $V_{H1}$ when or before the scanning signal $V_{scan}$ is at the high voltage level, to avoid the interference between successive frames. That is, in this photoelectric sensor, regardless of the voltage of various determinal during the prior frame, when the next frame arrives, the voltage of the internal terminals, e.g., the control node Q, of the photoelectric sensor is uniformly preset to a high voltage level when or before the photoelectric sensor is selected by the scanning signal $V_{scan}$ (i.e., $V_{scan}$ is at a high voltage level), so that the interference between two successive frames is effectively avoided.

In the stage (1) shown in FIG. 2(a), the voltage $V_Q$ of the control node Q is preset to the high voltage level $V_{H1}$ when the scanning signal $V_{scan}$ of this frame is at the high voltage level. In a preferred embodiment, the high voltage level $V_{H1}$ can be set as high enough to turn on the transistor T2.

Because the scanning signal $V_{scan}$ is at the high voltage level in the stage (1), the transistor T7 is turned on, and the scanning signal $V_{scan}$ charges the control node Q to raise the voltage $V_Q$ of the control node Q, so as to turn on the transistor T2. At this time, the first clock signal $V_A$ is at the high voltage level. As such, the voltage $V_o$ of the signal output terminal is charged to the high voltage level, which in turn causes the voltage $V_Q$ of the control node Q to further raise to $V_{H2}$ due to bootstrap, as illustrated in stage (2) of this figure. In stage (3), the first clock signal $V_A$ is at the low voltage level, so the voltage $V_o$ of the signal output terminal is discharged to the low voltage level. It should be noted that, in this frame, the scanning signal $V_{scan}$ received by a scanning line coupled to a photoelectric sensor is at the high voltage level in stage (1), and is at the low voltage level at other time. When the transistor T2 is turned on, because $V_{scan}$ is turned to a low voltage level, the transistor T7 is turned off and the control node Q will not leak current through the transistor T7. As for the transistor T8, although there is a leakage current in response to illumination intensity, this current is too small compared with the amount of charge at the terminal Q, not enough to significantly influence the amount of charge and the voltage value at the terminal Q within several row scanning durations. Therefore, the transistor T2 still maintains at on-state within the limited row scanning durations. The first clock signal $V_A$ continually charges and discharges the signal output terminal along with its high and the low voltage levels, i.e., repeating the stages (2) and (3) of FIG. 2(a).

Photosensing Stage

Please refer to FIG. 2(b). The photo sensing stage is a stage that the photoelectric sensor receives illumination within a period of time longer than the row scanning duration. According to various illumination intensity, the photoelectric sensor outputs various voltages $V_o$. Specifically, the photoelectric sensing unit 3 uses a leakage current which is in response to the intensity of external illumination to release charges from the control node Q over a period of time, that is, the control node Q is discharged so that the voltage $V_Q$ of the control node Q is less than the driving voltage. As a result, the pulse transmission unit 2 is turned off, causing the voltage of the signal output terminal $V_o$ to change.

As stated above, the transistor T2 is turned on in the voltage preset stage. Therefore, when the first clock signal $V_A$ is at the high voltage level, the output terminal $V_o$ is pulled up to the high voltage level, as illustrated in the stage (2) of the FIG. 2(a). When the first clock signal $V_A$ is at the low voltage level, the output terminal $V_o$ is pulled down to the low voltage level, as illustrated in the stage (3) of the FIG. 2(a). Therefore, in the following time, along with the clock signal $V_A$ turning to the high or the low voltage level periodically, the voltage of the output terminal $V_o$ turns to the high or the low voltage level periodically.

There is a leakage current in response to external illumination in the photoelectric sensing unit 3. The leakage current still exists even in complete darkness, which may cause release of charges at the control node Q. Specifically, there is a leakage current flowing from the second electrode to the first electrode of the transistor T8, releasing the charges at the control node Q. As such, the high voltage level amplitude of the voltage $V_Q$ of the control node Q is pulled down gradually, which causes the high voltage level amplitude of the voltage $V_o$ of the signal output terminal is reduced gradually.

As illustrated in FIG. 2(a), although the high voltage level reduction of $V_Q$ and $V_o$ cannot be noticed obviously within limited row scanning durations, the gradual reduction of the high voltage level amplitude of $V_Q$ and $V_o$ can be seen within one frame time, as illustrated in FIG. 2(b).

Therefore, over a period time within one frame time, when the charges at the control node Q is reduced to a certain level so that the voltage $V_Q$ of the control node is not enough to turn on the transistor T2, and the transistor T2 may be turned off. Even if the first clock signal $V_A$ continuously switches between the high and the low voltage levels, the voltage at the signal output terminal $V_o$ maintains at the low voltage level, and is not affected by $V_A$.

As stated above, the charge leakage of the control node Q is caused by the leakage current of the photoelectric sensing unit 3, and the leakage current is closely related to the illumination intensity on the photoelectric sensing unit 3. When the illumination intensity increases, the leakage current increases expotentially. According to the equation: charge=current*time, as the illumination intensity increases, the leakage rate of $V_Q$ and $V_o$ increases, which means, $V_Q$ and $V_o$ may be reduced to the low voltage level in a shorter time. Especially compared with the dark state, in the illumination state, it can be obviously observed that the leakage rate of $V_Q$ and $V_o$ increases significantly, and $V_Q$ and $V_o$ turn to the low voltage level more quickly.

If t1 is defined as the time when a pulse waveform appears at the output $V_o$ in the photo sensing stage, i.e., the time during which the voltage at $V_o$ is reduced from high voltage level to the low voltage level. As stated above, the more the illumination intensity is, the shorter t1 is, and the less the illumination intensity is, the longer t1 is. Therefore, according to the photoelectric sensor of the present application, the functional relationship between illumination intensity and t1 is established. The illumination intensity can be determined by calculating the time when a pulse waveform appears on the output $V_o$ in the photo sensing stage, that is, the time that the high voltage level of $V_o$ reduced to the low voltage level costs.

Embodiment II

In the photoelectric sensor in Embodiment I, the pulse control unit 1 and the photoelectric sensing unit 3 are implemented with different units. In some preferred embodiments, the pulse control unit 1 and the photoelectric sensing unit 3 are implemented with the transistor T7 and the transistor T8 respectively. The advantage is that, since the functions of voltage preset and illumination intensity sensing, i.e., the functions for providing the driving voltage to the pulse transmission unit 2 and releasing the charges at the control node Q of the pulse transmission unit 2, have different requirements for transistors' sizes, when the pulse control unit 1 and the photoelectric sensing unit 3 are different units, it is convenient for optimizing the transistor T7 and the transistor T8 respectively, so as to achieve the best result of each function.

Figure 3:
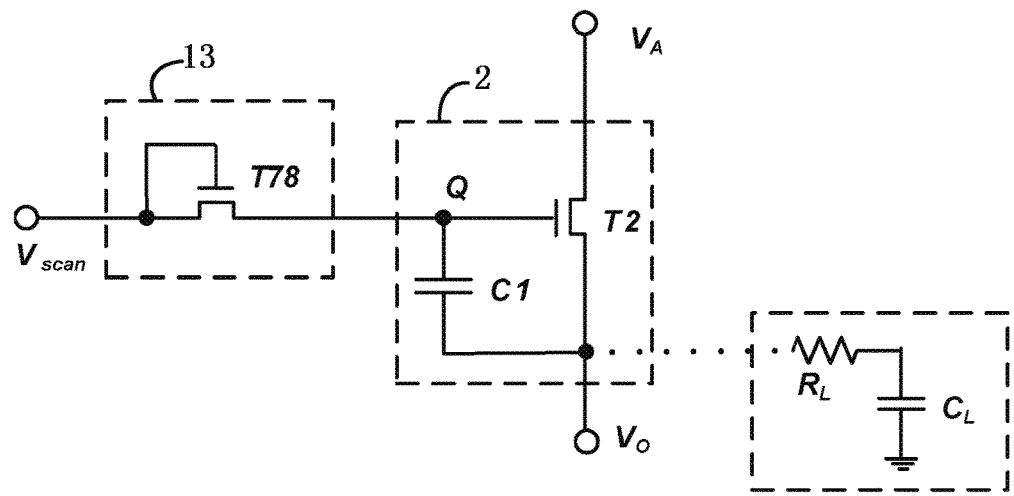
FIG. 3 illustrates a structure diagram of a photoelectric sensor according to Embodiment II of the present application.

Please refer to FIG. 3. In Embodiment II, in order to reduce the number of devices, the pulse control unit 1 and the photoelectric sensing unit 3 may also be a same unit 13. The unit 13 can realize the functions of the pulse control unit 1 and the photoelectric sensing unit 3. In a preferred embodiment, the unit 13 comprises a transistor T78. The transistor T78 is a photosensitive transistor. The first electrode of the transistor T78 may be coupled to its control electrode. The first electrode of the transistor T78 may also be coupled to the signal input terminal for receiving the scanning signal $V_{scan}$. The second electrode of the transistor T78 may be coupled to the control node Q of the pulse transmission unit 2. The transistor T78 is configured to charge the control node Q of the pulse transmission unit 2 for providing the driving voltage when the scanning signal $V_{scan}$ is at the high voltage level, and to provide a leakage current in response to the intensity of external illumination when receiving the external illumination. The leakage current flows from the second electrode of the transistor T78 to its first electrode discharging the control node Q of the pulse transmission unit 2, so that the voltage at the control node of the pulse transmission unit is less than the driving voltage.

The working principle and sequence diagram of the photoelectric sensor in this embodiment are the same as those in Embodiment I, and hence they are not repeated here.

Embodiment III

In order to avoid noise voltage caused by clock feed-through effect at the signal output terminal, on the basis of Embodiment I or Embodiment II, the photoelectric sensor in this embodiment also comprises a low voltage level maintenance unit 4, which is configured to maintain the voltage of the signal output terminal $V_o$ at a low voltage level under the control a second clock signal Vs, wherein the second clock signal Vs and the first clock signal $V_A$ have the same period but opposite phases.

Figure 4:
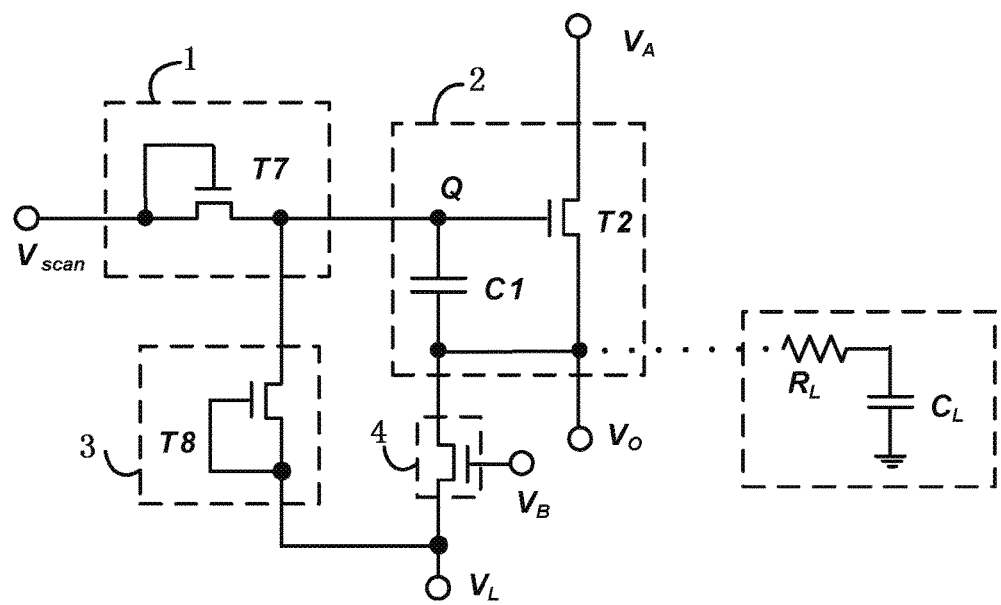
FIG. 4 illustrates a circuit diagram of a photoelectric sensor according to Embodiment III of the present application.

Please refer to FIG. 4, according to a preferred embodiment on the basis of Embodiment I, the low voltage level maintenance unit 4 comprises a transistor T3. The transistor T3 is a non-photosensitive transistor. The control electrode of the transistor T3 is configured to receive the second clock signal $V_B$. The first electrode of the transistor T3 is coupled to the signal output terminal $V_o$. The second electrode of the transistor T3 is coupled to the low voltage level supply $V_L$ to pull down the voltage at the signal output terminal $V_o$ to the voltage of the low voltage level supply $V_L$ when the second clock signal $V_B$ is at the high voltage level, so as to maintain the voltage at the signal output terminal $V_o$ at the low voltage level.

Figure 5:
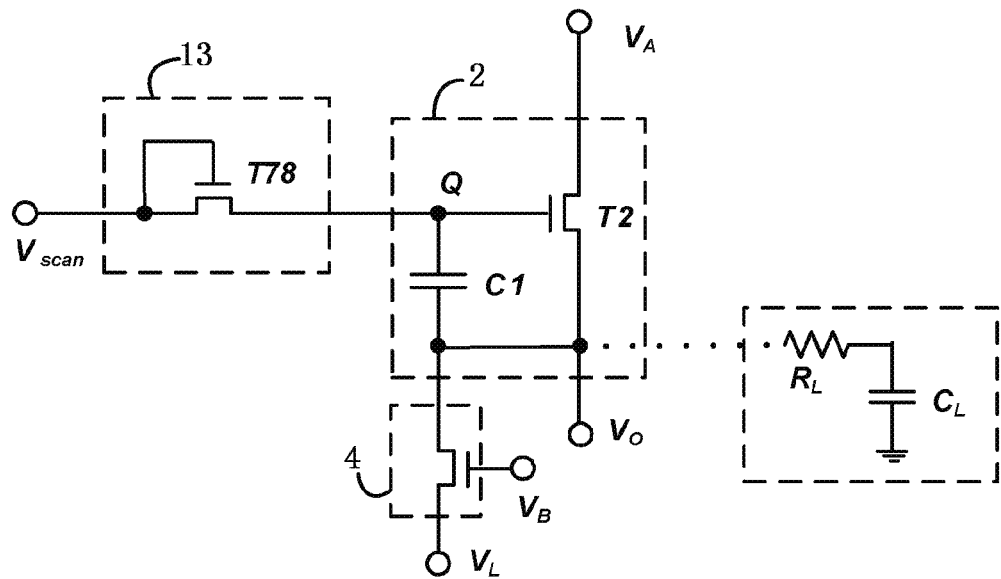
FIG. 5 illustrates another circuit diagram of a photoelectric sensor according to Embodiment III of the present application.

FIG. 5 illustrates a preferred embodiment on the basis of Embodiment II, and its low voltage level maintenance unit 4 is same as that in FIG. 4, hence it is not repeated here.

Figure 6:
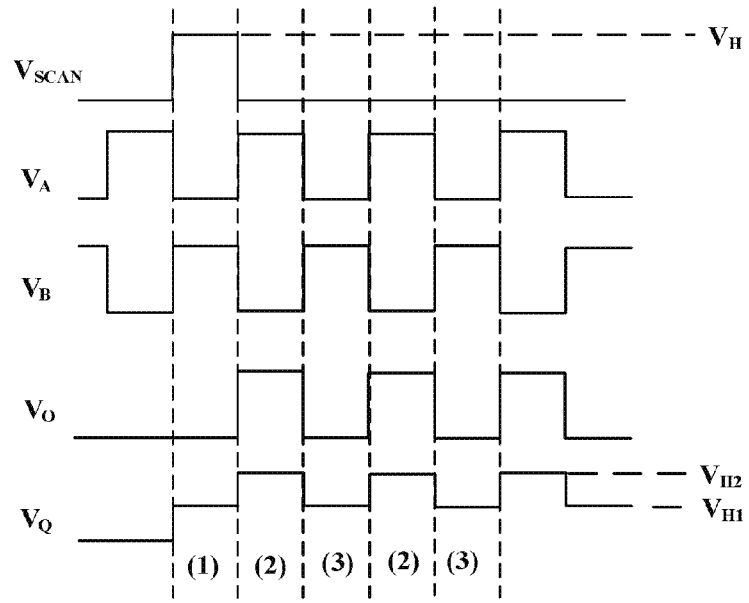
FIG. 6 illustrates sequence diagrams of the photoelectric sensor in Embodiment III of the present application.
Figure 6:
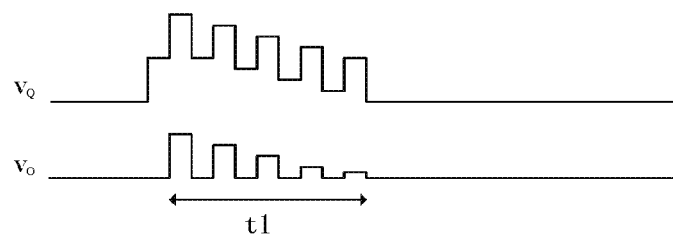

Please refer to FIG. 6, which is a sequence diagram of the photoelectric sensor according to Embodiment III.

In the voltage preset stage and the photo sensing state, because the second clock signal VB and the first clock signal $V_A$ have the same period but opposite phases, when the pulse transmission unit 2 is in on-state and the first clock signal $V_A$ charges the signal output terminal to the high voltage level. The second clock signal VB is at the low voltage level, and the transistor T3 is in off-state. The low voltage level supply $V_L$ will not influence the first clock signal $V_A$ charging the signal output terminal. When the first clock signal $V_A$ discharges the signal output terminal to pull down $V_o$ to be at the low voltage level, the second clock signal VB is at the high voltage level, and the transistor T3 is in on-state. Therefore, both the transistor T2 and the transistor T3 are configured to pull down the voltage of the signal output terminal $V_o$ to the low voltage level.

After the photo sensing state, according to Embodiment I, the voltages at the control node Q and the signal output terminal in the photoelectric sensor circuit should maintain at the low voltage level. However, it is inevitable that some noise voltage exists at the control node Q and the signal output terminal due to the voltage feed-through effect. With respect to the pulse transmission unit 2, there are overlapping area between the control electrode and the first electrode and between the control electrode and the second electrode of the transistor T2, which inevitably bring parasitic capacitances $C_{GD}$ and $C_{GS}$ (not illustrated in the figure) related to the control electrode of the transistor T2, wherein the parasitic capacitance $C_{GD}$ refers to the parasitic capacitance between the control electrode and the first electrode of the transistor T2, and the parasitic capacitance $C_{GS}$ refers to the parasitic capacitance between the control electrode and the second electrode of the transistor T2. Especially, because of the parasitic capacitance $C_{GD}$, $V_Q$ and $V_o$ may follow the first clock signal $V_A$ switching between the high and the low voltage levels, which may influence the measurement of the time for $V_o$ to be reduced from the high voltage level to the low voltage level. As a result, the determination of illumination intensity is also influenced. For example, in the photo sensing stage, after a period of time t1, the high voltage level at the signal output terminal should disappear. However, due to the voltage feed-through effect, a pulse signal (i.e., a high voltage level) reappears after the high voltage level at the signal output terminal disappears, which may lead to misjudgment of the time for $V_o$ to be reduced from the high voltage level to the low voltage level. Therefore, in order to avoid the influence of the voltage feed-through effect, the photoelectric sensor needs to proceed to a low voltage level maintenance stage after the photo sensing stage. The transistor T3 is turned on under the control of the second clock signal $V_B$, so as to release the possible noise charges at the signal output terminal. Because the second clock signal VB is also a periodic signal, the transistor T2 can be turned on periodically, so that the charges at the signal output terminal would not accumulate, in order to maintain the voltage at the signal output terminal at the low voltage level.

Embodiment IV

In Embodiment III, although the low voltage level maintenance unit 4 can eliminate the noise voltage of the signal output terminal, the voltage $V_Q$ at the control node Q may still be influenced by the voltage feed-through effect. If the parasitic capacitance is large, the noise voltage at the control node Q may exceed the threshold voltage of the transistor T2, causing the transistor T2 to be turned on by mistake. The mistakenly turning on of the transistor T2 caused by the voltage feed-through effect may bring a noise voltage with a large amplitude to the voltage at the signal output terminal $V_o$. At this time, the ability of the low voltage level maintenance unit 4 for maintaining $V_o$ to be at the low voltage level is limited. To avoid this, a module suppressing the voltage feed-through effect is introduced in this embodiment.

This embodiment can be implemented on the basis of any of Embodiment I to Embodiment III, and this embodiment is illustrated below on the basis of embodiment III.

Figure 7:
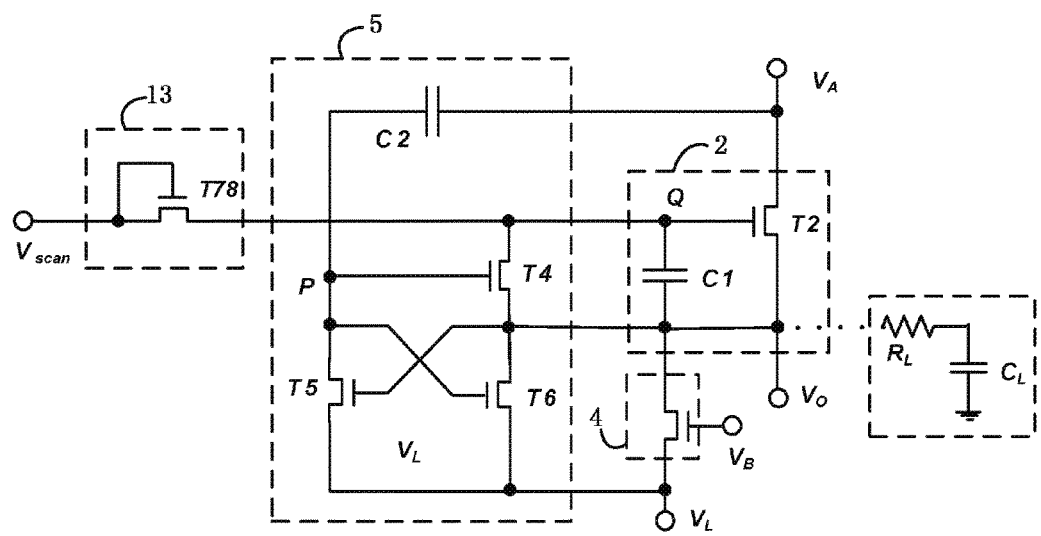
FIG. 7 illustrates a structure diagram of a photoelectric sensor according to Embodiment IV of the present application.

Please refer to FIG. 7. On the basis of the photoelectric sensor shown in FIG. 5 of Embodiment III, this embodiment also comprises a voltage feed-through suppression unit 5, which is configured to pull down the voltages at the signal output terminal and the control node of the pulse transmission unit to maintain them at the low voltage level under the control of the first clock signal $V_A$. In a preferred embodiment, the voltage feed-through suppression unit 5 comprises a transistor T4, a transistor T5, a transistor T6, and a coupling capacitance C2. The transistors T4, T5, and T6 are non-photosensitive transistors.

The control electrode of the transistor T4, the first electrode of the transistor T5, the control electrode of the transistor 6, and one end of the coupling capacitance C2 are coupled to the same node P. The other end of the coupling capacitance C2 is coupled to the terminal receiving the first clock signal $V_A$. The second electrode of the transistor T4, the control electrode of the transistor T5, and the first electrode of the transistor T6 are coupled to the signal output terminal. The first electrode of the transistor T4 is coupled to the control node Q of the pulse transmission unit 2. The second electrodes of the transistors T5 and T6 are coupled to the low voltage level supply $V_L$. The transistor T5 is configured to pull down the voltages at the control electrodes of the transistors T4 and T6 to the voltage of the low voltage level supply $V_L$ when the voltage of the signal output terminal $V_o$ is at the high voltage level, so that the transistors T4 and T6 are turned off to prevent leakage current at the signal output terminal and the control node Q of the pulse transmission unit 2. The coupling capacitance C2 is configured to, after the voltage $V_Q$ at the control node Q of the pulse transmission unit 2 is less that the driving voltage, couple a high voltage level to the control electrodes of the transistors T4 and T6 when the first clock signal $V_A$ is at the high voltage level, so that the transistors T4 and T6 are turned on to pull down the voltages at the signal output terminal and the control node Q of the pulse transmission unit 2 to the voltage of the low voltage level supply $V_L$.

The working principle of the voltage feed-through suppression unit 5 is explained below.

In the low voltage level maintenance stage after the photo sensing stage, due to the existence of coupling capacitance C2, when the first clock signal $V_A$ turns to the high voltage level, the voltage of the node P rises to a high voltage level, so the transistors T4 and T6 are turned on. Both the voltage $V_Q$ at the control node Q and the voltage at the signal output terminal are pulled down to the voltage of the low voltage level supply $V_L$. It should be noted that, the voltage at the node P depends on the ratio of the coupling capacitance C2 and other capacitances on the node P. When the value of the coupling capacitance C2 is large, the voltage at the node P can be adjusted to a large value, so as to turn on the transistors T4 and T6.

In the voltage preset stage and the photo sensing stage, when the voltage at the signal output terminal $V_o$ is at the high voltage level, because the control electrode of the transistor T5 is coupled to the signal output terminal, the transistor T5 is turned on, therefore the voltage at the node P is pulled down to the low voltage level. Since the control electrodes of the transistors T4 and T6 are coupled to the node P, the transistors T4 and T6 are turned off, therefore in the voltage preset stage and the photo sensing stage, when the photoelectric sensor needs to output a high voltage level, leakage of the charges at the control node Q and the signal output terminal are suppressed.

Therefore, in the low voltage level maintenance stage, the voltage feed-through suppression unit 5 can maintain the voltage $V_Q$ at the control node Q and the voltage at the signal output terminal at the low voltage level. In the voltage preset stage and the photo sensing stage, the voltage feed-through suppression unit 5 can ensure the signal output terminal to be charged correctly. Furthermore, the voltage feed-through suppression unit 5 can also avoid the interference between the photo sensing stage and the low voltage level maintenance stage, so as to improve the reliability of the photoelectric sensor.

Figure 8:
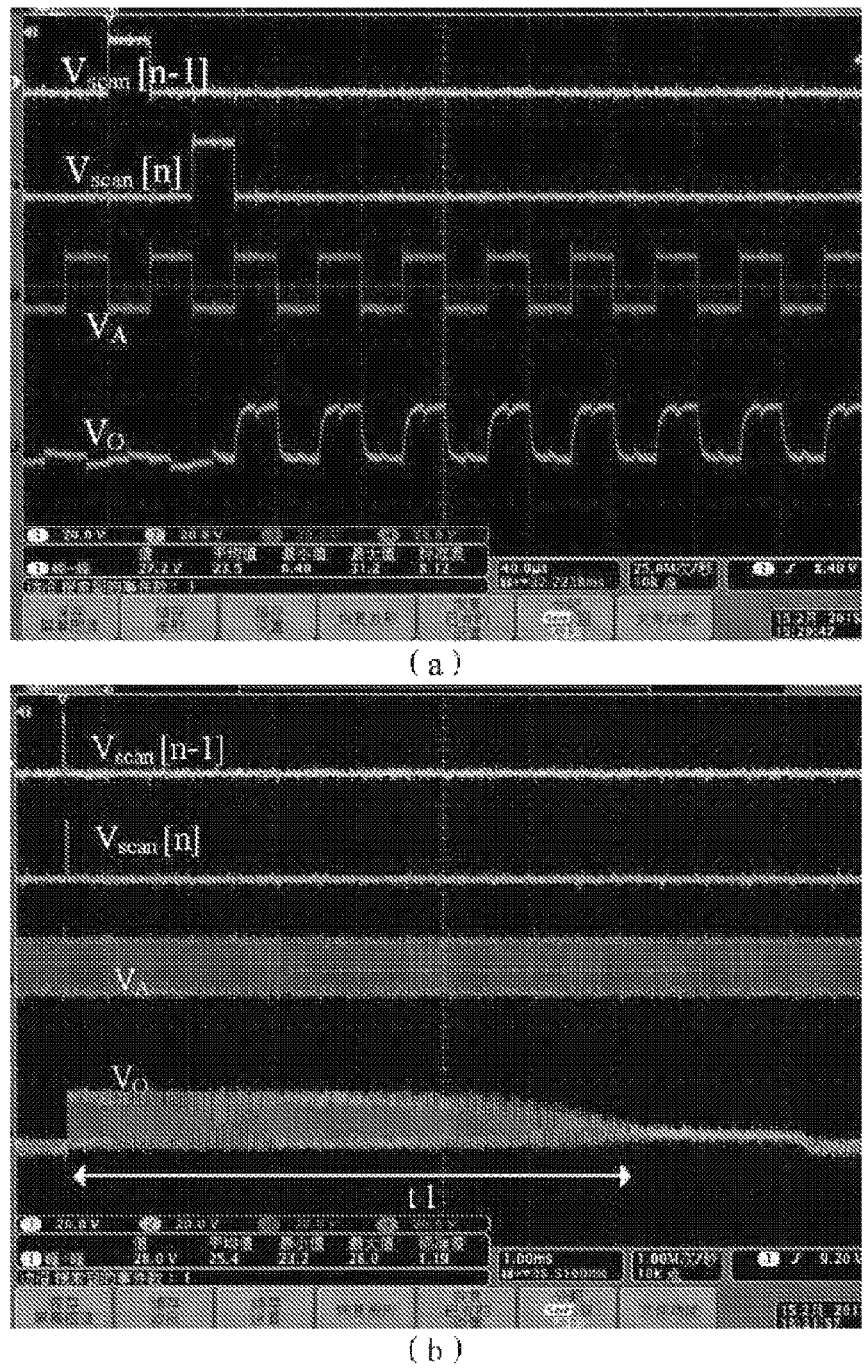
FIG. 8 illustrates test response curves of the photoelectric sensor in Embodiment IV of the present application under darkness state in several row scanning durations and one frame time.

In order to verify the function of the photoelectric sensor proposed in the present application, amorphous silicon TFT (a-Si TFT) are adopted to manufacture the photo sensing circuit of Embodiment IV, and test of the circuit is taken. FIG. 8(a) illustrates test response curves of the photoelectric sensor in the darkness state in several row scanning durations, and FIG. 8(b) illustrates test response curves of the photoelectric sensor in the darkness state in one frame time, wherein $V_{scan}[n-1]$ and $V_{scan}[n]$ are two adjacent scanning signals, $V_A$ is the first clock signal, and $V_o$ is the output signal of the photoelectric sensor. According to the test result diagram, the results are consistent with the aforementioned analysis. As illustrated in FIG. 8(a), in several row scanning durations, in the presence of the scanning signal $V_{scan}[n]$ and the first clock signal $V_A$, $V_o$ outputs pulse signals (i.e., high voltage levels) periodically. As illustrated in FIG. 8(b), in one frame time, the pulse amplitude output by $V_o$ begins to reduce after 5 ms. In the darkness state, the duration of the pulse at the signal output terminal exceeds 6 ms.

Figure 9:
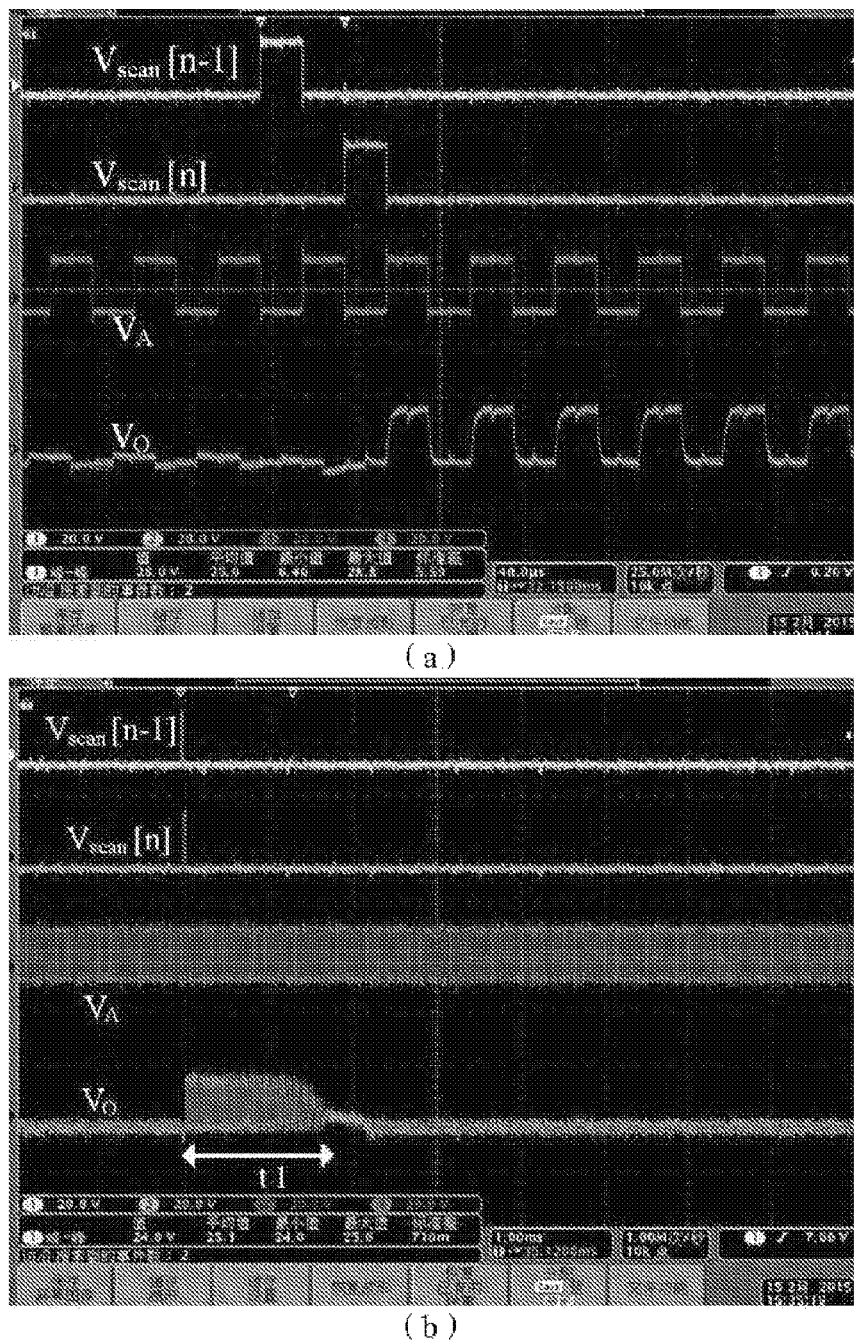
FIG. 9 illustrates test response curves of the photoelectric sensor in Embodiment IV of the present application under illumination state in several row scanning durations and one frame time.

As a comparison to the test results in the darkness state, FIG. 9(a) illustrates test response curves of the photoelectric sensor in the illumination state in several row scanning durations, and FIG. 9(b) illustrates test response curves of the photoelectric sensor in the illumination state in one frame time. In several row scanning durations, there is no significant difference between the periodical pulse output signals of the signal output terminal in the darkness state and in the illumination state. However, in one frame time, under the illumination state, the high voltage level amplitude at the pulse signal $V_o$ output by the signal output terminal begins to reduce after 1 ms. In the illumination state, the pulse duration of the signal output terminal is about 1.5 ms. As such, the illumination condition significantly influences the output $V_o$ of the photoelectric sensor. If the structure and the size of the transistor T78 are further optimized and sizes of other components in the photoelectric sensor circuit are also optimized, the illumination intensity sensitivity of the photoelectric sensor may be further improved.

The above are some preferred embodiments of the photoelectric sensor in the present application. The present application exploits the electrical characteristic that the transistors, such as the thin film transistors (TFT), changes significantly in the presence of external illumination to design a photoelectric sensor. The photoelectric sensor reasonably uses scanning signals and clock signals of the display panel to control. As such, the circuit structure is simple, without introducing too complex control signal as a conventional photoelectric sensor. Because the photoelectric sensor reasonably uses scanning signals and clock signals of the display panel, it is suitable for being integrated into a display panel, especially TFT display panel, and suitable for being used in applications of some flexible electronic devices. Therefore, the present application also proposes a display panel comprising the photoelectric sensor of the above embodiments. The display panel has a high added value, and the complexity of the mechanical structure and the circuit of the display panel almost will not increase.

It should be noted that, the photoelectric sensor is easily integrated into a display panel, and also can be applied in other fields that test illumination intensity or test other indexes by testing illumination intensity. At this time, it is possible that there is no existing scanning signal, then it just need to use an existing scanning signal of other fields or add a control signal.

This application is illustrated above by specific embodiments, which is merely used to comprehend this application and cannot be construed as limiting this application. Persons skilled in the art can make variations to the above embodiments according to the spirit of this application.

What is claimed is:

1. A photoelectric sensor, comprising:
a signal input terminal, configured to receive a scanning signal;
a signal output terminal, configured to output a pulse signal;
a pulse transmission unit, comprising a control node, after obtaining a driving voltage, the control node of the pulse transmission unit transmits a first clock signal to the signal output terminal;
a pulse control unit, configured to receive the scanning signal from the signal input terminal and charge the control node of the pulse transmission unit so as to provide the driving voltage;
a photoelectric sensing unit, configured to provide a leakage current in response to intensity of external illumination when receiving the external illumination, wherein the control node of the pulse transmission unit is discharged due to the leakage current, so that voltage at the control node of the pulse transmission unit is less than the driving voltage after a period of time.

2. The photoelectric sensor of claim 1, wherein the pulse control unit comprises a transistor, the transistor is a non-photosensitive transistor; a first electrode of the transistor is coupled to its control electrode; the first electrode of the transistor is also coupled to the signal input terminal for receiving the scanning signal; a second electrode of the transistor is coupled to the control node of the pulse transmission unit for charging of the control node of the pulse transmission unit when the scanning signal is at high voltage level to provide the driving voltage.

3. The photoelectric sensor of claim 1, wherein the photoelectric sensing unit comprises a transistor, the transistor is a photosensitive transistor; a first electrode of the transistor is coupled to its control electrode; the first electrode of the transistor is also coupled to a low voltage level supply, a second electrode is coupled to the control node of the pulse transmission unit; the transistor is configured to provide a leakage current in response to intensity of external illumination when receiving the external illumination, the leakage current flowing from the second electrode of the transistor to its first electrode for performing discharging of the control node of the pulse transmission unit, so that the voltage at the control node of the pulse transmission unit is less than the driving voltage.

4. The photoelectric sensor of claim 1, wherein the photoelectric sensor and the photoelectric sensing unit is one same unit, the unit comprises a transistor, the transistor is a photosensitive transistor; a first electrode of the transistor is coupled to a control electrode; the first electrode of the transistor is also coupled to the signal input terminal for receiving the scanning signal; a second electrode is coupled to the control node of the pulse transmission unit; the transistor is configured to charge the control node of the pulse transmission unit when the scanning signal is at high voltage level to provide the driving voltage, and to provide a leakage current in response to intensity of external illumination when receiving the external illumination, the leakage current flowing from the second electrode of the transistor to its first electrode for discharging of the control node of the pulse transmission unit, so that the voltage of the control node of the pulse transmission unit is less than the driving voltage.

5. The photoelectric sensor of claim 1, wherein the pulse transmission unit comprises a transistor, the transistor is a non-photosensitive transistor; a control electrode of the transistor is the control node of the pulse transmission unit; a first electrode of the transistor is configured to receive a first clock signal; a second electrode of the transistor is coupled to the signal output terminal, so as to, after the transistor is turned on by the driving voltage, charge the signal output terminal when the first clock signal is at high voltage level and to discharge the signal output terminal when the first clock signal is at low voltage level.

6. The photoelectric sensor of claim 1, further comprises a low voltage level maintenance unit configured to maintain the voltage at the signal output terminal at low voltage level under the control of a second clock signal, the second clock signal and the first clock signal having the same period but opposite phases.

7. The photoelectric sensor of claim 6, wherein the low voltage level maintenance unit comprises a transistor, the transistor is a non-photosensitive transistor; a control electrode of the transistor is configured to receive the second clock signal, a first electrode of the transistor is coupled to the signal output terminal, a second electrode of the transistor is coupled to low voltage supply to pull down the voltage of the signal output terminal to the voltage of the low voltage supply when the second clock signal is at high voltage level, so as to maintain the voltage at the signal output terminal at low voltage level.

8. The photoelectric sensor of claim 1, further comprises a voltage feed-through suppression unit configured to pull down the voltages at the signal output terminal and the control node of the pulse transmission unit to maintain them at low voltage level under the control of the first clock signal.

9. The photoelectric sensor of claim 8, wherein the voltage feed-through suppression unit comprises a transistor, a transistor, a transistor, and a coupling capacitance, wherein the transistor, the transistor and the transistor are non-photosensitive transistors, a control electrode of the transistor, a first electrode of the transistor, a control electrode of the transistor, and one end of the coupling capacitance are coupled to a same node, the other end of the coupling capacitance is configured to receive the first clock signal; a second electrode of the transistor, a control electrode of the transistor, and a first electrode of the transistor are coupled to the signal output terminal; a first electrode of the transistor is coupled to the control node of the pulse transmission unit, second electrodes of the transistors are coupled to the low voltage supply;
the transistor is configured to pull down the voltages at the control electrodes of the transistors to voltage of the low voltage supply when the voltage at the signal output terminal is at high voltage level, so that the transistors are turned off to prevent current leakage at the signal output terminal and the control node of the pulse transmission unit;
the coupling capacitance is configured to, after the voltage at the control node of the pulse transmission unit is less that the driving voltage, couple high voltage level to the control electrodes of the transistors when the first clock signal is at high voltage level, so that the transistors are turned on to pull down the voltages at the signal output terminal and the control node of the pulse transmission unit to the voltage of the low voltage supply.

10. A display panel comprising the photoelectric sensor according to claim 9.

\* \* \* \* \*